(12) United States Patent
Morii

(10) Patent No.: US 11,387,078 B2
(45) Date of Patent: Jul. 12, 2022

(54) IMPEDANCE MATCHING DEVICE AND IMPEDANCE MATCHING METHOD

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 174 days.

(21) Appl. No.: 16/809,950

(22) Filed: Mar. 5, 2020

(65) Prior Publication Data

US 2020/0303166 A1  Sep. 24, 2020

(30) Foreign Application Priority Data

Mar. 22, 2019  (JP) .............................. JP2019-055109

(51) Int. Cl.
*H01J 37/32* (2006.01)
*H01J 37/24* (2006.01)

(52) U.S. Cl.
CPC ...... *H01J 37/32183* (2013.01); *H01J 37/241* (2013.01)

(58) Field of Classification Search
CPC ........................... H01J 37/32183; H01J 37/241
See application file for complete search history.

(56) References Cited

U.S. PATENT DOCUMENTS

| | | |
|---|---|---|
| 7,251,121 B2 | 7/2007 | Bhutta |
| 7,298,128 B2 | 11/2007 | Bhutta |
| 9,196,459 B2 | 11/2015 | Bhutta |
| 9,306,533 B1 | 4/2016 | Mavretic |
| 9,345,122 B2 | 5/2016 | Bhutta |
| 9,496,122 B1 | 11/2016 | Bhutta |
| 9,525,412 B2 | 12/2016 | Mavretic |
| 9,543,122 B2 | 1/2017 | Bhutta |
| 9,584,090 B2 | 2/2017 | Mavretic |
| 9,591,739 B2 | 3/2017 | Bhutta |
| 9,697,991 B2 | 7/2017 | Bhutta |
| 9,728,378 B2 | 8/2017 | Bhutta et al. |
| 9,729,122 B2 | 8/2017 | Mavretic |
| 9,745,660 B2 | 8/2017 | Bhutta |

(Continued)

FOREIGN PATENT DOCUMENTS

| | | | |
|---|---|---|---|
| JP | 2012-142285 A | 7/2012 | |
| JP | 2013-125892 A | 6/2013 | |

(Continued)

*Primary Examiner* — Dinh T Le
(74) *Attorney, Agent, or Firm* — Peter W. Schroen; Bret E. Field; Bozicevic, Field & Francis LLP

(57) ABSTRACT

An impedance matching device is to be provided between a load and a high frequency power supply in which output power is modulated to a high output and a low output alternately. The impedance matching device calculates an impedance or a reflection coefficient of a case where the load side is viewed from an output end of the high frequency power supply. The impedance matching device performs, based on results of the calculations performed in a first period in which the output power is the high output and in a second period in which the output power is the low output, operations for the impedance matching in the subsequent second period and first period respectively. The impedance matching device achieves, based on results of these operations, the impedance matchings in the subsequent first period and second period respectively.

4 Claims, 9 Drawing Sheets

(56) References Cited

U.S. PATENT DOCUMENTS

| | | | |
|---|---|---|---|
| 9,755,641 B1 | 9/2017 | Bhutta | |
| 9,844,127 B2 | 12/2017 | Bhutta | |
| 9,865,432 B1 | 1/2018 | Bhutta | |
| 10,026,594 B2 | 7/2018 | Bhutta | |
| 10,217,608 B2 | 2/2019 | Mavretic | |
| 10,340,879 B2 | 7/2019 | Mavretic et al. | |
| 10,431,424 B2 | 10/2019 | Mavretic et al. | |
| 10,431,428 B2 | 10/2019 | Bhutta et al. | |
| 10,454,453 B2 | 10/2019 | Bhutta et al. | |
| 10,455,729 B2 | 10/2019 | Bhutta | |
| 10,460,912 B2 | 10/2019 | Bhutta et al. | |
| 10,483,090 B2 | 11/2019 | Bhutta et al. | |
| 10,699,881 B2 * | 6/2020 | Wei | H01J 37/32183 |
| 2012/0168081 A1 | 7/2012 | Son | |
| 2015/0000841 A1 | 1/2015 | Yamada et al. | |
| 2015/0122420 A1 | 5/2015 | Konno et al. | |
| 2016/0065207 A1 | 3/2016 | Bhutta | |
| 2016/0380610 A1 | 12/2016 | Ulrich | |
| 2017/0178865 A1 | 6/2017 | Ulrich | |
| 2017/0372873 A1 * | 12/2017 | Yamada | H01J 37/32165 |
| 2018/0076788 A1 | 3/2018 | Decker et al. | |
| 2019/0172683 A1 | 6/2019 | Mavretic et al. | |
| 2019/0267212 A1 | 8/2019 | Mavretic | |
| 2019/0272978 A1 | 9/2019 | Ahmed et al. | |
| 2019/0326094 A1 | 10/2019 | Bhutta | |

FOREIGN PATENT DOCUMENTS

| | | |
|---|---|---|
| JP | 2015-90759 A | 5/2015 |
| JP | 2016-105489 A | 6/2016 |

* cited by examiner

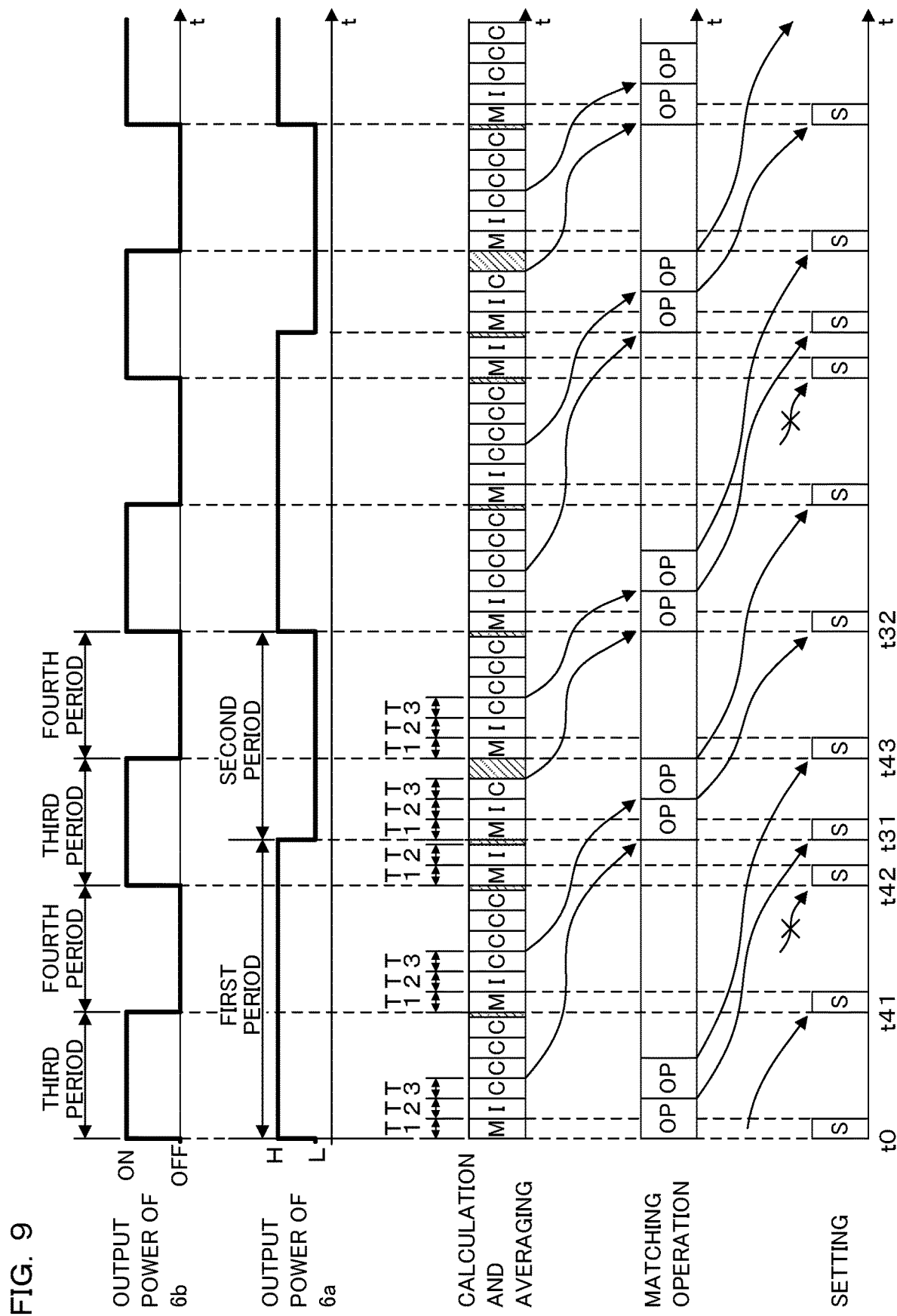

US 11,387,078 B2

IMPEDANCE MATCHING DEVICE AND IMPEDANCE MATCHING METHOD

CROSS-REFERENCE TO RELATED APPLICATION

This Nonprovisional application claims priority under 35 U.S.C. § 119(a) on Patent Application No. 2019-055109 filed in Japan on Mar. 22, 2019, the entire contents of which are hereby incorporated by reference.

FIELD

The present disclosure relates to an impedance matching device and an impedance matching method for achieving impedance matching between a high frequency power supply and a load.

BACKGROUND

As one of methods for supplying high frequency power to a plasma processing apparatus used in the manufacture of semiconductor devices and the like, there is a following method. In this method, high frequency power of a relatively high frequency suitable for plasma generation is supplied from a first power supply to an upper electrode. High frequency power of a relatively low frequency suitable for attracting ions included in plasma in an object to be processed is supplied from a second power supply to a lower electrode.

In a case where the first power supply and second power supply are used, a technique for suppressing so-called charging damage to a substrate to be processed has been proposed. In this technique, amplitude shift modulation of a high frequency power of the first power supply is performed so that the high frequency power is modulated to ON and OFF (or H level and L level) at a first frequency. Thereby, the time for continuously generating plasma is shortened so that the charging damage is suppressed. In addition, a technique for making the etching rate uniform by reducing the so-called microloading effect has been proposed. In this technique, the high frequency power of the second power supply is modulated to ON and OFF (or H level and L level) at the second frequency so that time during which etching of a predetermined film on the substrate to be processed is performed is interrupted. Thereby, microloading effect is reduced.

On the other hand, in a case where the high frequency power of the first power supply or the second power supply is modulated as described above, the impedance (load impedance) of the plasma processing apparatus periodically changes in synchronization with the modulation. For this reason, it is difficult to make the matching operations of impedance matching devices, each of which is provided between each of the first power supply and the second power supply and the plasma processing apparatus, follow the change.

Japanese Patent Application Laid-Open No. 2015-90759 and Japanese Patent Application Laid-Open No. 2016-105489 disclose a following technique. In this technique, when the power of the high frequency HF (corresponding to the high frequency power of the first power supply) is modulated to ON and OFF (or H level and L level) at a predetermined frequency, the moving average of the average value of the load impedance relevant to the high frequency HF for each modulation period is calculated. Thereby, even in a case where the modulation frequency is relatively high, there is an effect of preventing the life of the impedance matching device having a movable unit from being shortened.

In addition, Japanese Patent Application Laid-Open No. 2015-90759 discloses a following technique. In this technique, when the power of the high frequency LF (corresponding to the high frequency power of the second power supply) is modulated to ON and OFF (or H level and L level) at a predetermined frequency, the weighted average of the load impedance relevant to the high frequency HF within the modulation period of the high frequency LF is calculated. The calculation result is set as an average value of the load impedance for each modulation period. According to this technique, even in a case where amplitude modulation of the power of the high frequency LF is performed, the power of the high frequency HF can be optimized.

SUMMARY

However, according to the method using the moving average described in Japanese Patent Application Laid-Open No. 2015-90759 and Japanese Patent Application Laid-Open No. 2016-105489, the high frequency power of the first power supply cannot be optimally controlled for each modulation period.

In addition, the method using the weighted average described in Japanese Patent Application Laid-Open No. 2015-90759 is not assumed to be applied to a case where amplitude shift modulation of the high frequency power of the first power supply is performed. Even if the method using the weighted average described in Japanese Patent Application Laid-Open No. 2015-90759 is applied, impedance matching cannot be optimally achieved regarding high frequency powers having different amplitudes within the modulation period.

The present disclosure has been made in view of such circumstances, and an object thereof is to provide an impedance matching device and an impedance matching method capable of achieving impedance matching between a power supply and a load even in a case where amplitude shift modulation of the high frequency power supplied from the power supply to the load is performed.

An impedance matching device according to an aspect of the present disclosure is to be provided between a load and a high frequency power supply in which amplitude shift modulation of output power is performed at a predetermined frequency. The impedance matching device achieves impedance matching between the high frequency power supply and the load. In the high frequency power supply, the output power is modulated to a high output and a low output alternately. The impedance matching device includes: an acquisition unit that acquires information regarding an impedance of a case where the load side is viewed from an output end of the high frequency power supply or from a location equivalent to the output end; a calculation unit that calculates the impedance or a reflection coefficient of the case where the load side is viewed, using the information regarding the impedance, acquired by the acquisition unit; an operation unit that performs, based on results of the calculations performed by the calculation unit in a first period in which the output power is the high output and in a second period in which the output power is the low output, operations for the impedance matchings in the subsequent second period and first period respectively; and a matching unit that performs, based on results of operations performed by the operation unit in the second period and the first period, the impedance matchings in the subsequent first period and second period respectively.

In an impedance matching method according to an aspect of the present disclosure, impedance matching between a load and a high frequency power supply in which amplitude shift modulation of output power is performed at a predetermined frequency is performed. In the high frequency power supply, the output power is modulated to a high output and a low output alternately. The impedance matching method includes: acquiring information regarding an impedance of a case where the load side is viewed from an output end of the high frequency power supply or a location equivalent to the output end; calculating the impedance or a reflection coefficient of the case where the load side is viewed, using the acquired information regarding the impedance; performing, based on results of the calculations performed in a first period in which the output power is the high output and in a second period in which the output power is the low output, operations for the impedance matchings in the subsequent second period and first period respectively; and achieving, based on results of the operations performed in the second period and the first period, the impedance matching in the subsequent first period and second period respectively.

According to this aspect, amplitude shift modulation of the output power of the high frequency power supply is performed at the predetermined frequency. Impedance matching between the high frequency power supply and the load is achieved in a state in which the output power of the high frequency power supply is supplied to the load. Information regarding the impedance of the case where the load side is viewed from the output end of the high frequency power supply or the location equivalent to the output end is acquired from the outside. The impedance or the reflection coefficient on the load side is calculated using the acquired information. The location equivalent to the output end of the high frequency power supply is, for example, an input end on the high frequency power supply side of the impedance matching device that is connected between the high frequency power supply and the load.

In the first period and the second period, the output power of the high frequency power supply is modulated to the high output and the low output respectively. It is assumed that the impedances on the load side are calculated in the first period and the second period respectively. In this case, matching operations are performed in the subsequent second period and first period so that the impedances on the load side after adjustment approach a complex conjugate of the output impedance of the high frequency power supply. It is assumed that the reflection coefficients are calculated in the first period and the second period respectively. In this case, matching operations are performed in the subsequent second period and first period so that the actual reflection coefficients approach 0. The results of the matching operations performed in the second period and the first period respectively are reflected actually by the matching unit in the subsequent first period and second period. As a result, even in a case where the impedance on the load side changes in the first period and the second period due to the influence of the modulation of the high frequency power supply, impedance matchings between the high frequency power supply and the load can be achieved in the first period and the second period respectively after one period of amplitude shift modulation for the high frequency power supply.

In the impedance matching device according to the aspect of the present disclosure, power is supplied to the load from a second high frequency power supply in which amplitude shift modulation of output power is performed at a frequency that is an integral multiple of the predetermined frequency. In the second high frequency power supply, the output power is modulated to a high output and a low output alternately. The operation unit performs, based on results of the calculations performed by calculation unit in a third period and a fourth period included in the first period, operations for the impedance matching sequentially in the subsequent second period. The third period is a period in which the output power of the second high frequency power supply is the high output. The fourth period is a period in which the output power of the second high frequency power supply is the low output. The operation unit performs, based on results of the calculations performed by the calculation unit in the third period and the fourth period included in the second period, operations for the impedance matching sequentially in the subsequent first period. The matching unit achieves, based on results of operations performed sequentially by the operation unit in the second period, the impedance matchings in the third period and the fourth period included in the subsequent first period. The matching unit achieves, based on results of operations performed sequentially by the operation unit in the first period, the impedance matching in the third period and the fourth period included in the subsequent second period.

According to this aspect, amplitude shift modulation of the output power of the second high frequency power supply is performed at a frequency which is an integral multiple of the predetermined frequency. Impedance matching between the high frequency power supply and the load is achieved in a state in which the output power of the second high frequency power supply is further supplied to the load. The output power of the second high frequency power supply is modulated to a high output and a low output in the third period and the fourth period, respectively.

In a case where the impedances on the load side are calculated in the third period and the fourth period included in the first period respectively, matching operations are sequentially performed in the subsequent second period so that the impedances on the load side after adjustment approach the complex conjugate of the output impedance of the high frequency power supply. Similarly, in a case where the impedances on the load side are calculated in the third period and the fourth period included in the second period respectively, matching operations are sequentially performed in the subsequent first period so that the impedances on the load side after adjustment approach the complex conjugate of the output impedance of the high frequency power supply. In a case where the reflection coefficients are calculated in the third period and the fourth period included in the first period, matching operations are sequentially performed in the subsequent second period so that the actual reflection coefficients approaches zero. Similarly, in a case where the reflection coefficients are calculated in the third period and the fourth period included in the second period respectively, matching operations are sequentially performed in the subsequent first period so that the actual reflection coefficients approach zero.

The results of the matching operations sequentially performed in the second period are reflected actually by the matching unit in the third period and the fourth period included in the subsequent first period. Similarly, the results of the matching operations sequentially performed in the first period are reflected actually by the matching unit in the third period and the fourth period included in the subsequent second period. As a result, even in a case where the impedance on the load side changes in the third period and the fourth period due to the influence of the modulation of the second high frequency power supply, impedance matchings between the high frequency power supply and the load can be achieved in the first period and the second period after one period of amplitude shift modulation for the high frequency power supply.

An impedance matching device according to an aspect of the present disclosure is to be provided between a load, to which power is supplied from a first high frequency power supply in which amplitude shift modulation of output power is performed at a predetermined frequency, and a second high frequency power supply. The impedance matching device achieves impedance matching between the second high frequency power supply and the load. In the first high frequency power supply, the output power is modulated to a high output and a low output alternately. The impedance matching device includes: an acquisition unit that acquires information regarding an impedance of a case where the load side is viewed from an output end of the second high frequency power supply or from a location equivalent to the output end; a calculation unit that calculates the impedance or a reflection coefficient of the case where the load side is viewed, using the information regarding the impedance acquired by the acquisition unit; an operation unit that performs, based on results of the calculations performed by calculation unit in a first period in which the output power is the high output and in a second period in which the output power is the low output, operations for the impedance matching in the subsequent second period and first period respectively; and a matching unit that performs, based on results of the operations performed by the operation unit in the second period and the first period, the impedance matchings in the subsequent first period and second period respectively.

According to this aspect, amplitude shift modulation of the output power of the first high frequency power supply is performed at the predetermined frequency. Impedance matching between the load and the second high frequency power supply that further supplies power to the load in a state in which the output power of the first high frequency power supply is supplied to the load is achieved. Information regarding the impedance of a case where the load side is viewed from the output end of the second high frequency power supply or from the location equivalent to the output end is acquired from the outside. The impedance or the reflection coefficient on the load side is calculated using the acquired information. The location equivalent to the output end of the second high frequency power supply is, for example, an input end on the second high frequency power supply side of the impedance matching device that is connected between the second high frequency power supply and the load.

In the first period and the second period, the output power of the first high frequency power supply is modulated to the high output and the low output. It is assumed that the impedances on the load side are calculated in the first period and the second period respectively. In this case, matching operations are performed in the subsequent second period and first period so that the impedances on the load side after adjustment approach a complex conjugate of the output impedance of the second high frequency power supply. It is assumed that the reflection coefficients are calculated in the first period and the second period respectively. In this case, matching operations are performed in the subsequent second period and first period so that the actual reflection coefficients approach 0. The results of the matching operations performed in the second period and the first period respectively are reflected actually by the matching unit in the subsequent first period and second period. As a result, even in a case where the impedance on the load side changes in the first period and the second period due to the influence of the modulation of the first high frequency power supply, impedance matchings between the second high frequency power supply and the load can be achieved respectively in the first period and the second period after one period of amplitude shift modulation for the first high frequency power supply.

According to the present disclosure, even in a case where amplitude shift modulation of the high frequency power supplied from the power supply to the load is performed, impedance matching between the power supply and the load can be achieved.

The above and further objects and features will move fully be apparent from the following detailed description with accompanying drawings.

BRIEF DESCRIPTION OF THE DRAWINGS

FIG. 9 is a timing chart showing the operation of the impedance matching device according to Embodiment 3.

DETAILED DESCRIPTION OF NON-LIMITING EXAMPLE EMBODIMENTS

Hereinafter, an impedance matching device according to the present disclosure will be described in detail with reference to the diagrams illustrating embodiments thereof.

Embodiment 1

Figure 1:
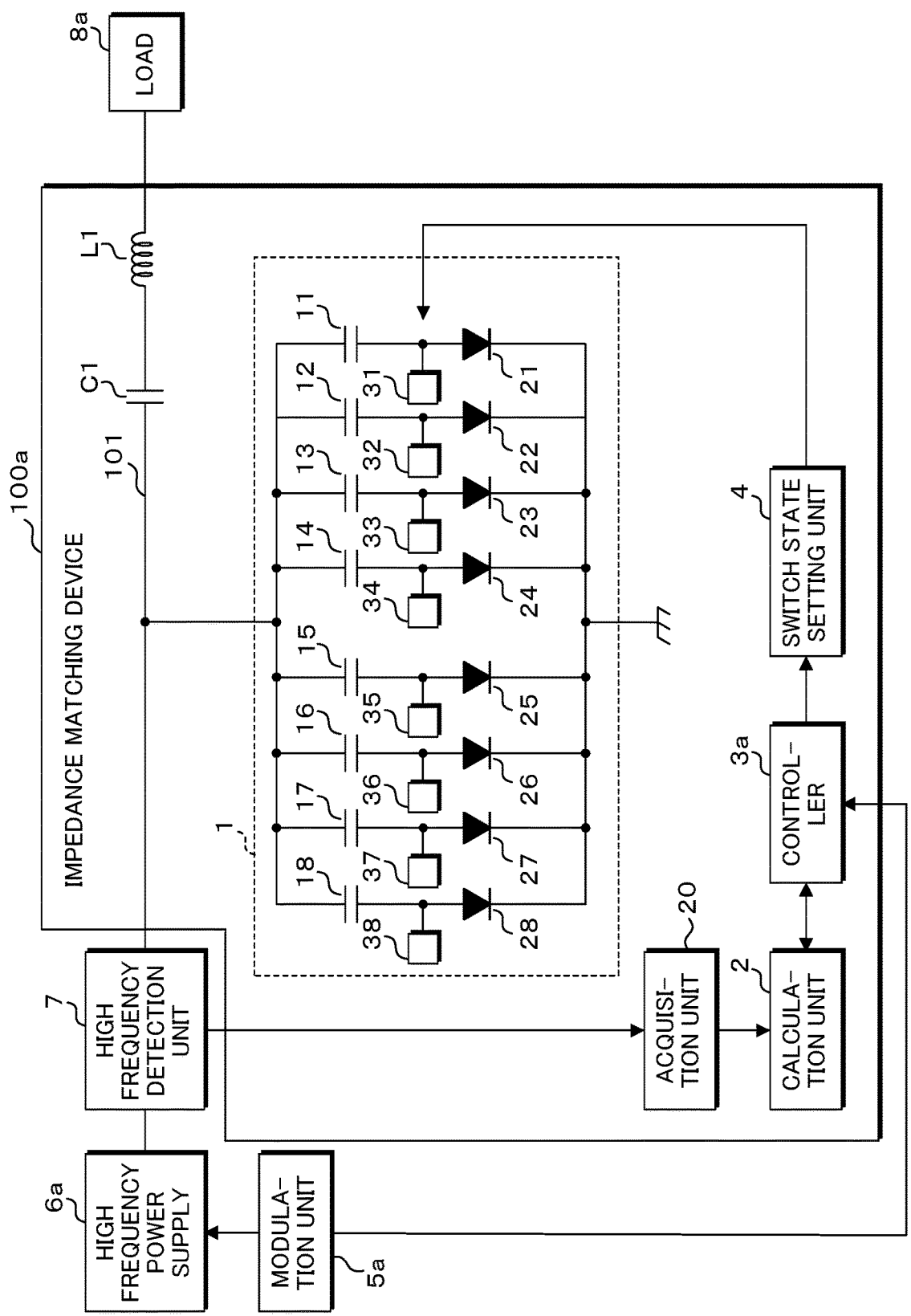
FIG. 1 is a block diagram illustrating a configuration example of an impedance matching device according to Embodiment 1 and an example of connection to the outside.

FIG. 1 is a block diagram illustrating a configuration example of an impedance matching device 100a according to Embodiment 1 and an example of connection to the outside. The impedance matching device 100a is provided between a high frequency power supply 6a that outputs high frequency power and a load 8a that consumes high frequency power. A high frequency detection unit 7 is connected between the high frequency power supply 6a and the impedance matching device 100a. The high frequency detection unit 7 allows high frequency power to pass therethrough and detects parameters, such as a high frequency voltage. That is, the high frequency detection unit 7 is interposed between the output end of the high frequency power supply 6a and the input end of the impedance matching device 100a. The high frequency detection unit 7 may be included in the impedance matching device 100a.

The high frequency power supply 6a is an AC (Alternating Current) power supply that outputs high frequency power of an industrial radio frequency (RF) band of 2 MHz, 13.56 MHz, 27 MHz, 60 MHz or the like, for example. The output impedance of the high frequency power supply 6a is set to a specified value, such as 50Ω, for example. The high frequency power supply 6a includes an inverter circuit (not illustrated), and generates high frequency AC power by controlling the switching of the inverter circuit.

Amplitude shift modulation of the output power of the high frequency power supply 6a is performed. The output power of the high frequency power supply 6a is modulated to H level (corresponding to high output) and L level (corresponding to low output) alternately by a modulation unit 5a. The modulation frequency of this modulation is, for example, a frequency which belongs to a range from several Hz to several hundred Hz (corresponding to a predetermined frequency). The modulation unit 5a gives a modulation signal indicating the periods of the H level and L level to a controller 3a described later.

Hereinafter, "of the case where the load 8 side is viewed from the output end of the high frequency power supply 6a or from the input end of the impedance matching device 100a" will be simply referred to as "of the case where the load 8a side is viewed" or "on the load 8a side". The input end of the impedance matching device 100a is a location equivalent to the output end of the high frequency power supply 6a. The high frequency detection unit 7 detects parameters for calculating the impedance of the case where the load 8a side is viewed or parameters for calculating a reflection coefficient of the case where the load 8a side is viewed. Each of these parameters corresponds to information regarding impedance. The impedance of the case where the load 8a side is viewed is the combined impedance obtained by combining the impedances of the load 8a and the impedance matching device 100a.

Specifically, the high frequency detection unit 7 detects, as parameters, a high frequency voltage, a high frequency current, and a phase difference between the high frequency voltage and the high frequency current at a position of the high frequency detection unit 7. Alternatively, the high frequency detection unit 7 detects, as parameters, high frequency traveling wave power (or a high frequency traveling wave voltage) toward the load 8a and reflected wave power (or a reflected wave voltage) which is reflected at the load 8a and is returned from the load 8a. Using these detected parameters, a calculation unit 2 described later calculates the impedance or the reflection coefficient on the load 8a side by a known method.

The load 8a performs various kinds of processing using high frequency power supplied from the high frequency power supply 6a. The load 8a is, for example, a plasma processing apparatus or a non-contact power transmission apparatus. In the plasma processing apparatus, the plasma state changes from moment to moment with the progress of manufacturing processes, such as plasma etching and plasma CVD. As a result, the impedance of the load 8a changes. The impedance of the load 8a also changes periodically according to the modulation signal.

The impedance matching device 100a includes: a variable capacitor 1 having a variable capacitance (corresponding to a matching unit); an acquisition unit 20 that acquires the parameters from the high frequency detection unit 7; the calculation unit 2 that calculates the impedance or the reflection coefficient on the load 8a side, using the parameters acquired by the acquisition unit 20; and the controller 3a that controls the capacitance of the variable capacitor 1, using the impedance or the reflection coefficient calculated by the calculation unit 2. The impedance matching device 100a further includes a switch state setting unit 4 for setting semiconductor switches described later to ON or OFF. The variable capacitor 1 includes the semiconductor switches. The controller 3a controls the capacitance of the variable capacitor 1 through the switch state setting unit 4.

In the impedance matching device 100a, a transmission line 101 extending to the high frequency detection unit 7 and a series circuit in which a capacitor C1 and an inductor L1 are connected in series are connected in cascade. One end of the capacitor C1 is connected to the load 8 through the inductor L1. The variable capacitor 1 is substantially a circuit having two ends. One end of the variable capacitor 1 is connected to the transmission line 101. The other end of the variable capacitor 1 is grounded. That is, the variable capacitor 1 and the series circuit including the capacitor C1 and the inductor L1 configure an L-type matching circuit. The capacitor C1 may be replaced with another variable capacitor 1.

Here, a case where the matching circuit is an L type has been described. However, the matching circuit may be an inverted L type, T type, or π type. In addition, the series circuit including the capacitor C1 and the inductor L1 may be placed on the outside of the impedance matching device 100a (that is, between the impedance matching device 100a and the load 8a). Hereinafter, a portion where high frequency power is input from the high frequency detection unit 7 to the transmission line 101 will be referred to as an input portion. In addition, a portion where high frequency power is output from the inductor L1 to the load 8a will be referred to as an output portion.

The variable capacitor 1 includes capacitors 11, 12, . . . , 18, semiconductor switches 21, 22, . . . , 28, and driving circuits 31, 32, . . . , 38. One end of each of capacitors 11, 12, . . . , 18 is connected to the transmission line 101. Each of semiconductor switches 21, 22, . . . , 28 is PIN diode. Anodes of semiconductor switches 21, 22, . . . , 28 are connected to the other ends of capacitors 11, 12, . . . , 18 respectively. Cathodes (the other ends) of the semiconductor switches 21, 22, . . . , 28 are grounded. Output ends of the driving circuits 31, 32, . . . , 38 are connected to connection nodes between the capacitors 11, 12, . . . , 18 and the semiconductor switches 21, 22, . . . , 28 respectively. The number of capacitors 11, 12, . . . , 18, the number of semiconductor switches 21, 22, . . . , 28, and the number of driving circuits 31, 32, . . . , 38 are not limited to eight.

The driving circuit 31 connects the semiconductor switch 21 to a predetermined positive power supply through a resistor (not illustrated) and an inductor (not illustrated) or connects the semiconductor switch 21 to a predetermined negative power supply through the inductor, according to whether the driving signal input from the switch state setting unit 4 is ON or OFF. As a result, the semiconductor switch 21 is turned on or off so that the capacitance of the capacitor 11 is included or not included in the capacitance of the entire variable capacitor 1. Thereby, the capacitance of the variable capacitor 1 is adjusted. The other driving circuits 32, 33, . . . , 38 turn on or off the semiconductor switches 22, 23, . . . , 28 respectively so as to adjust the capacitance of the variable capacitor 1. These adjustments are same as the adjustment performed by the driving circuit 31.

The acquisition unit 20 and the calculation unit 2 are, for example, configured by a circuit including a field programmable gate array (FPGA). The calculation unit 2 acquires parameters for calculating the impedance on the load 8a side or parameters for calculating the reflection coefficient on the load 8a side from the high frequency detection unit 7 through the acquisition unit 20. The calculation unit 2 calculates and averages the impedance or the reflection coefficient on the load 8a side using the acquired parameters, and outputs the averaged impedance or the averaged reflection coefficient to the controller 3a.

The controller 3a includes a central processing unit (CPU; not illustrated). The controller 3a controls the operation of each unit according to a control program stored in advance in a read only memory (ROM) and performs processings such as input and output, operation, and time measurement. A computer program that defines the procedure of each process performed by the CPU may be loaded in advance into a random access memory (RAM) using means that is not illustrated. In this case, the loaded computer program is performed by the CPU. Alternatively, the controller 3a may be configured by a microcomputer or a dedicated hardware circuit.

The controller 3a acquires the impedance or the reflection coefficient on the load 8a side that has been calculated by the calculation unit 2. In a case where the impedance on the load 8a side is acquired, the controller 3a determines the combination of the capacitors 11, 12, . . . , 18 of the variable capacitor 1 so that the impedance on the load 8a side matches the output impedance of the high frequency power supply 6a. In a case where the reflection coefficient on the load 8a side is acquired, the controller 3a determines the combination of the capacitors 11, 12, . . . , 18 of the variable capacitor 1 so that the reflection coefficient at the input portion approaches 0. If the magnitude of the reflection coefficient falls within the allowable range, it is considered that impedance matching has been achieved. By such control, power is efficiently supplied from the high frequency power supply 6a to the load 8a.

The following description will be given on the assumption that the calculation unit 2 calculates the impedance on the load 8a side and the controller 3a calculates the capacitance of the variable capacitor 1 using the calculated impedance and determines the combination of the capacitors 11, 12, . . . , 18. The determined combination of the capacitors 11, 12, . . . , 18 corresponds to ON/OFF states to be taken by the semiconductor switches 21, 22, . . . , 28.

The switch state setting unit 4 sets ON/OFF of the driving signals according to the combination of the capacitors 11, 12, . . . , 18 determined by the controller 3a, that is, ON/OFF states to be taken by the semiconductor switches 21, 22, . . . , 28. In a case where ON/OFF of the driving signals are set by the switch state setting unit 4, a driving signal that is controlled to be ON or OFF is given to each of the corresponding driving circuits 31, 32, . . . , 38. As a result, the ON/OFF states of the semiconductor switches 21, 22, . . . , 28 of the variable capacitor 1 are newly controlled. Then, the capacitance of the variable capacitor 1 is adjusted to the capacitance calculated by the controller 3a. Hereinafter, this adjustment will be referred to as setting of the variable capacitor 1.

Figure 2:
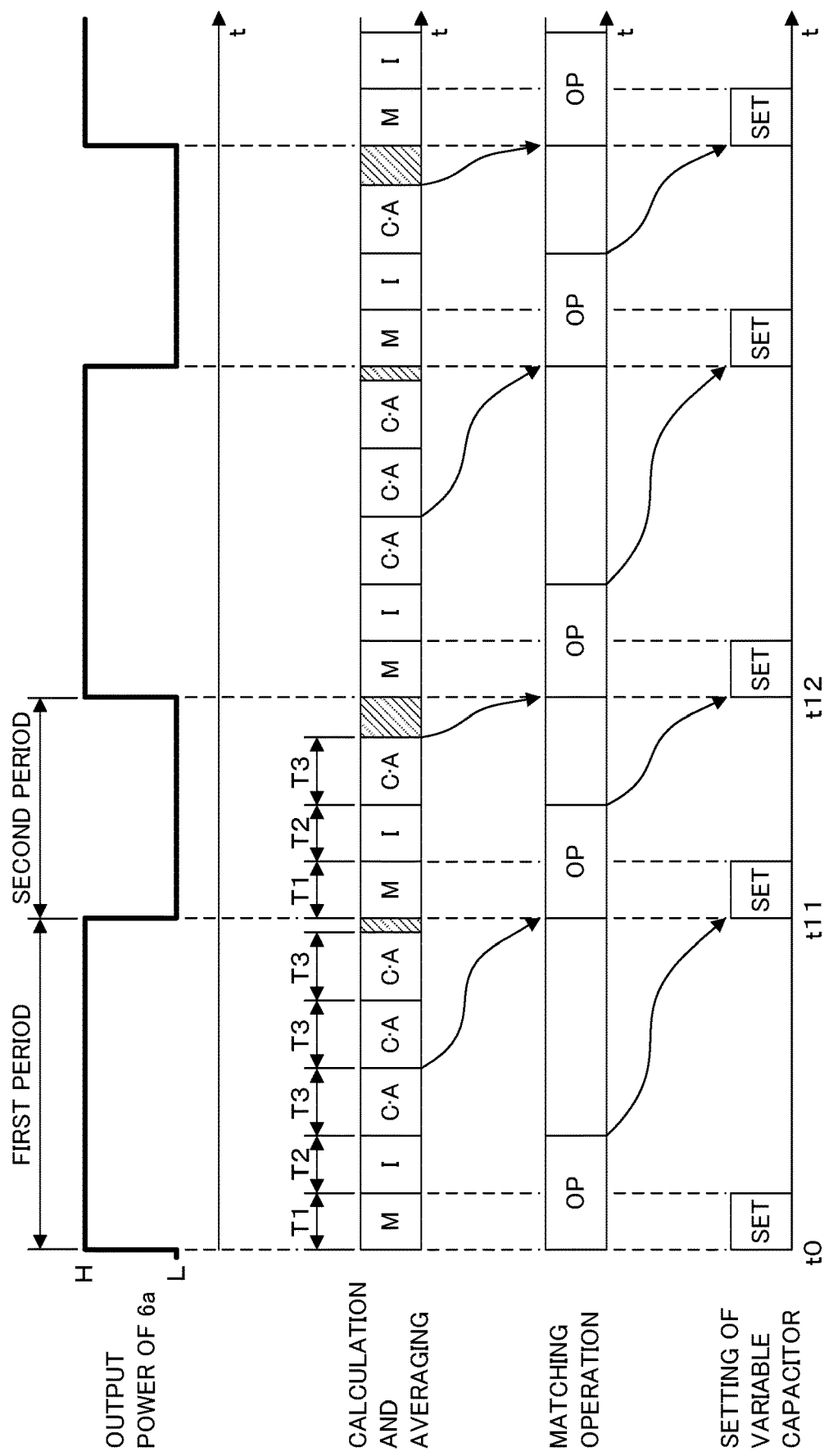
FIG. 2 is a timing chart showing the operation of the impedance matching device according to Embodiment 1.

Next, the operation flow of the entire impedance matching device 100a will be described. FIG. 2 is a timing chart showing the operation of the impedance matching device 100a according to Embodiment 1. The four timing charts shown in FIG. 2 have the same time axis (t) as their horizontal axes. In order from the top, timings regarding the output power of the high frequency power supply 6a, regarding calculation and averaging of the impedance on the load 8a side, regarding impedance matching operation, and regarding setting of the variable capacitor 1 are schematically shown. In FIG. 2, "C·A" means calculation and averaging. "OP" means a matching operation.

Among the operations corresponding to the timing charts shown in FIG. 2, the calculation and averaging of impedance are performed by the FPGA included in a circuit configuring the acquisition unit 20 and the calculation unit 2 (hereinafter, simply referred to as an FPGA). The impedance matching operation and the setting of the variable capacitor 1 are performed by the CPU included by the controller 3a (hereinafter, simply referred to as a CPU). A first period from time t0 to t11 corresponds to a period in which the output power of the high frequency power supply 6a is at the H level. A second period from time t11 to t12 corresponds to a period in which the output power of the high frequency power supply 6a is at the L level. Therefore, the first period and the second period appear every modulation period relevant to the high frequency power supply 6a.

The calculation unit 2 calculates and averages the impedance at least once in each of the first period and the second period. Although a result of first calculation and averaging is used herein, the used result is not limited to the result of the first calculation and averaging. Based on the results of calculations and averagings performed by the calculation unit 2 in the first period and in the second period, the controller 3a performs impedance matching operations in the subsequent second period and first period respectively. In each impedance matching operation, the capacitance of the variable capacitor 1 is calculated. Therefore, based on the result of calculation and averaging performed by the calculation unit 2 in the first period, the controller 3a performs an impedance matching operation in the subsequent second period. Based on the result of calculation and averaging performed by the calculation unit 2 in the second period, the controller 3a performs an impedance matching operation in the subsequent first period.

Based on the results of the matching operations performed in the second period and the first period, the controller 3a sets the driving signal to ON or OFF in the subsequent first period and second period respectively. Therefore, based on the result of the matching operation performed in the second period, the controller 3a sets the driving signals to ON or OFF in the subsequent first period. Based on the result of the matching operation performed in the first period, the controller 3a sets the driving signals to ON or OFF in the subsequent second period. As a result, the bits of the semiconductor switches 21, 22, . . . , 28 are set to ON or OFF.

The setting of the variable capacitor 1 that starts at time t0 is performed by the CPU during the time T1 based on the result of the matching operation performed by the CPU in the second period before the time t0. Here, the bits of the semiconductor switches 21, 22, . . . , 28 are set in descending order of bit numbers from the bit of the semiconductor switch 28 that is the most significant bit. However, the bits of the semiconductor switches 21, 22, . . . , 28 may be set in ascending order of bit numbers from the semiconductor switch 21 that is the least significant bit. In a case where the CPU can control ON/OFF of the semiconductor switches 21, 22, . . . , 28 in parallel, settings of all the semiconductor switches 21, 22, . . . , 28 may be performed at the same time. The CPU gives a mask signal to the FPGA. The CPU turns off the mask signal when the settings of all the semiconductor switches 21, 22, . . . , 28 are completed. "M" of FIG. 2 means ON of the mask signal.

The FPGA senses the mask signal given from the CPU. The FPGA sets an interval of time T2 from a time when the mask signal is turned off to a time when the calculation and averaging of the impedance on the load 8*a* side are started. "I" of FIG. 2 means the interval. The length of the time T2 is, for example, 30 μs. The impedance on the load 8*a* side changes according to the settings of the semiconductor switches 21, 22, . . . 28 performed while the mask signal is ON. The interval is a time during which the CPU waits until the impedance on the load 8*a* side is stabilized.

In a case where the interval ends, the FPGA acquires a parameter for calculating the impedance on the load 8*a* side from the high frequency detection unit 7 a plurality of times during time T3. The FPGA calculates and averages the impedance on the load 8*a* side each time the parameter is acquired. The length of the time T3 is, for example, 15 μs. In a case where the first calculation and averaging end in each of the first period and the second period, the FPGA outputs the averaged impedance to the CPU. This output is performed, for example, by being input to a first in first out (FIFO) memory (not illustrated) provided between the FPGA and the CPU. Thereafter, the FPGA repeats calculation and averaging of the impedance on the load 8*a* side every time T3. The calculation and averaging are repeated until the mask signal is turned on by the CPU.

The CPU acquires the averaged impedance from the FIFO memory at the start time of each of the subsequent second period and first period, performs an impedance matching operation, and temporarily stores the result of the matching operation in the buffer memory. The matching operation herein is processing for acquiring the averaged impedance on the load 8*a* side from the FPGA, calculating the capacitance of the variable capacitor 1 so that the impedance on the load 8*a* side matches the output impedance of the high frequency power supply 6*a*, and determining the ON/OFF states to be taken by the semiconductor switches 21, 22, . . . , 28.

The CPU further reads the result of the matching operation, that is, ON/OFF states to be taken by the semiconductor switches 21, 22, . . . , 28, from the buffer memory at the start time of each of the subsequent first period and second period. The CPU performs the setting of the variable capacitor 1 based on the read ON/OFF state. Specifically, the CPU sets driving signals for performing setting of the variable capacitor 1. The capacitance of the variable capacitor 1 is set according to the setting of the driving signals.

Figure 3:
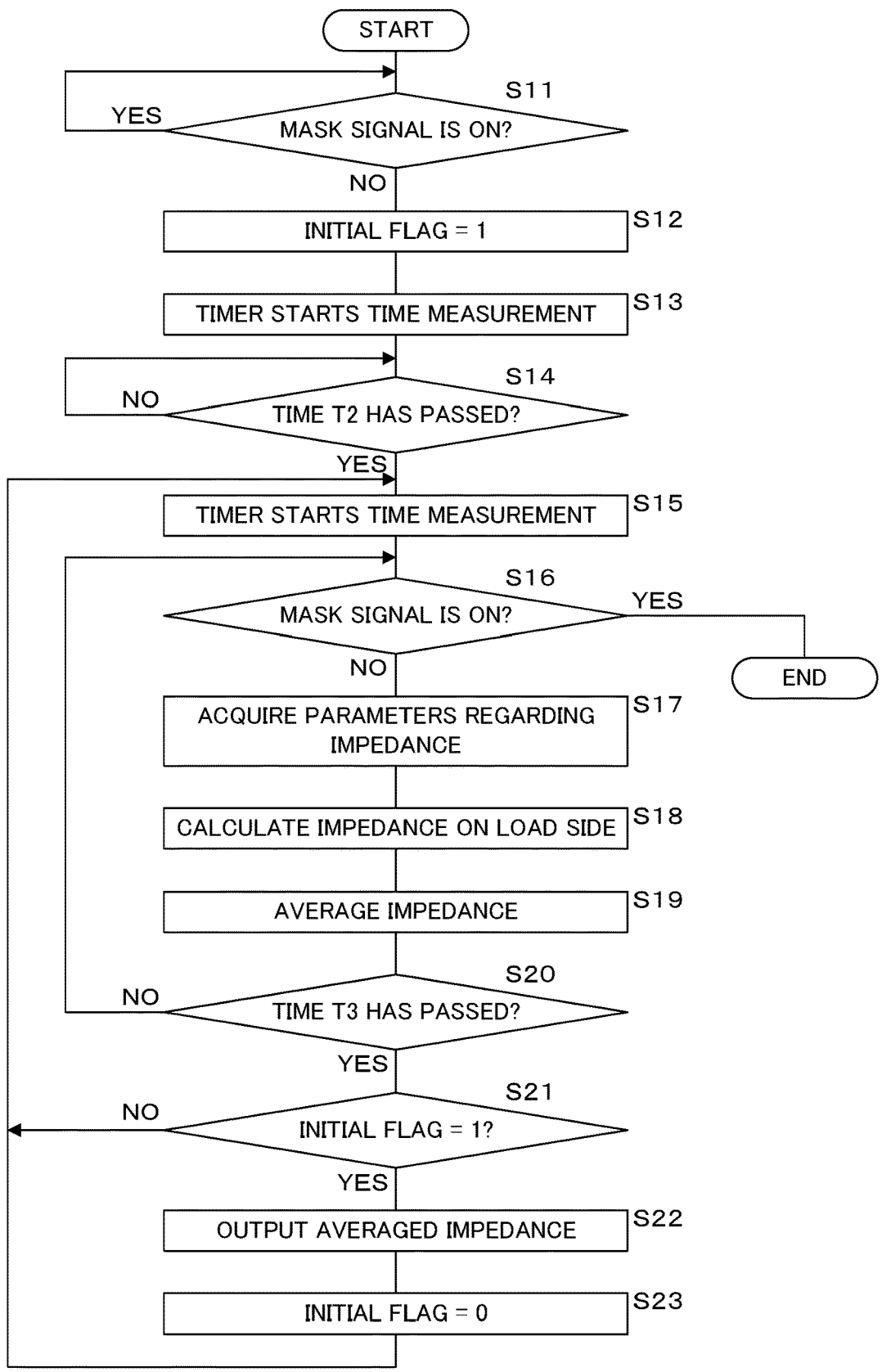
FIG. 3 is a flowchart illustrating a processing procedure of an FPGA that calculates and averages an impedance on the load side.
Figure 4:
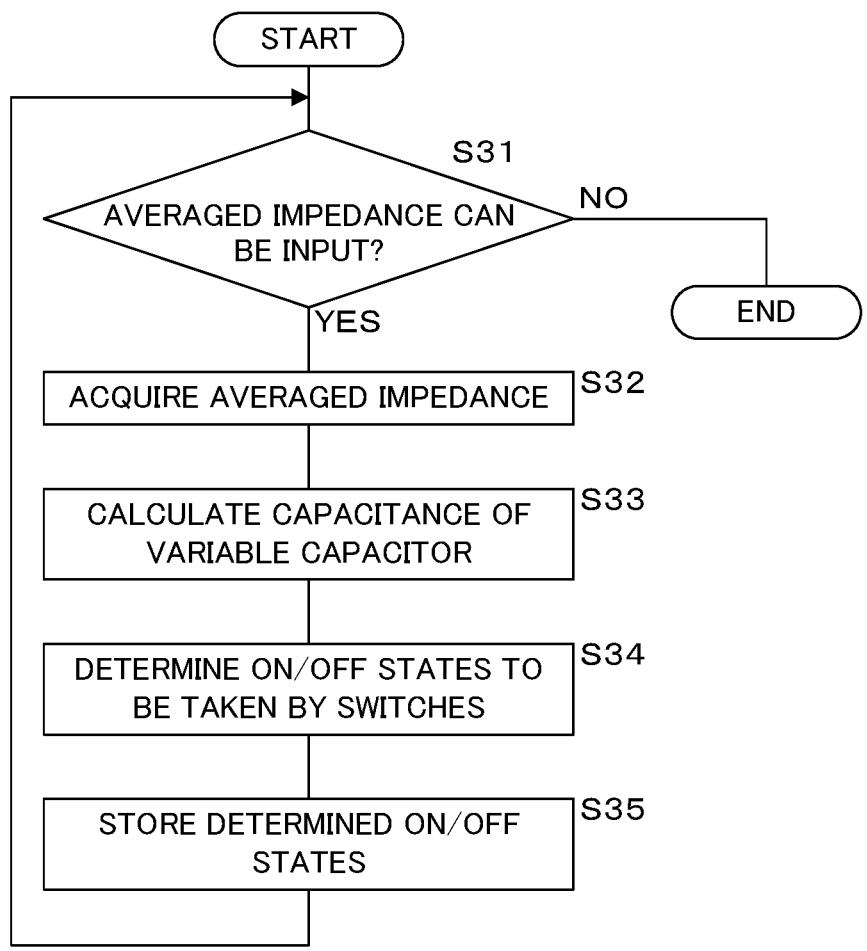
FIG. 4 is a flowchart illustrating the processing procedure of a CPU that performs an impedance matching operation.
Figure 5:
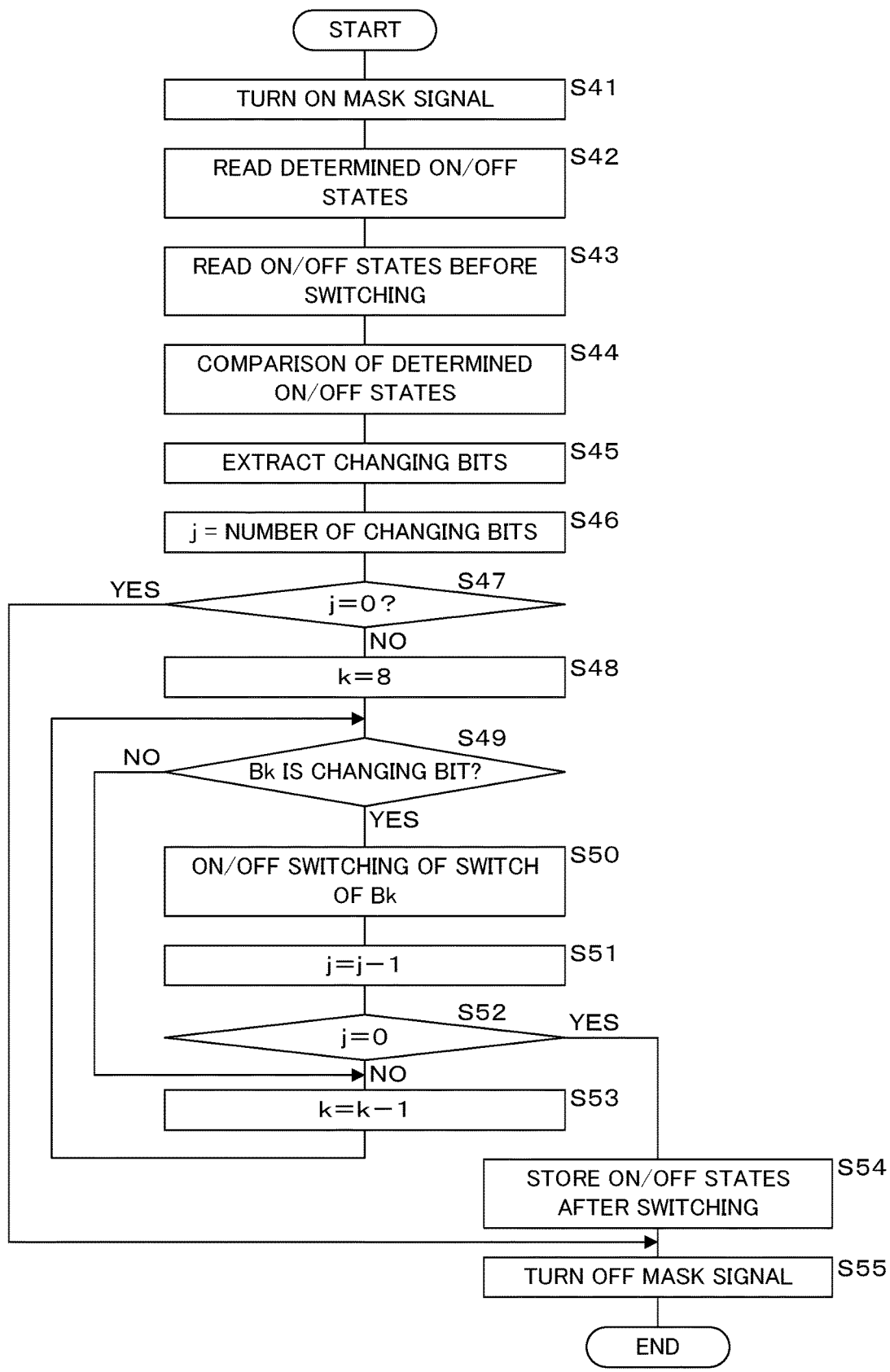
FIG. 5 is a flowchart illustrating the processing procedure of a CPU for ON/OFF switching of semiconductor switches in the impedance matching device according to Embodiment 1.

Hereinafter, operations of the calculation unit 2 and the controller 3*a* described above will be described with reference to the flowchart illustrating the operations. FIG. 3 is a flowchart illustrating the processing procedure of the FPGA that calculates and averages the impedance on the load 8*a* side. FIG. 4 is a flowchart illustrating the processing procedure of the CPU that performs an impedance matching operation. FIG. 5 is a flowchart illustrating the processing procedure of the CPU for ON/OFF switching of the semiconductor switches 21, 22, . . . , 28. The process illustrated in FIG. 3 is started while the above-described mask signal is ON. The process illustrated in FIG. 3 is performed by the FPGA. The processes illustrated in FIGS. 4 and 5 are started at each start time of the first period and the second period. The process illustrated in FIGS. 4 and 5 are performed by the CPU according to a computer program stored in advance in a ROM (not illustrated).

The initial value of the mask signal is ON. In FIGS. 4 and 5, the semiconductor switch is simply referred to as a switch.

The initial flag shown in FIG. 3 is a flag indicating the first processing for calculating and averaging the impedance. In FIG. 5, j is used for storing the number of changing bits among the bits of the semiconductor switches 21, 22, . . . , 28, and k is used for storing the bit number under processing.

In a case where the process illustrated in FIG. 3 is started, the FPGA determines whether or not the mask signal given from the CPU is ON (S11). In a case where the mask signal is ON (S11: YES), the FPGA waits until the mask signal is turned off. In a case where the mask signal is turned off so that the mask is removed (S11: NO), the FPGA sets the initial flag to 1 (S12), and starts time measurement using a timer (not illustrated) (S13). Thereafter, the FPGA determines whether or not the time T2 has passed based on the time measured by the timer (S14). In a case where the time T2 has not passed (S14: NO), the FPGA waits until the time T2 passes. This time T2 is the interval described above.

In a case where the interval of time T2 has passed (S14: YES), the FPGA starts time measurement using a timer (S15), and determines whether or not the mask signal is ON (S16). In a case where the mask signal is ON (S16: YES), the FPGA ends the process illustrated in FIG. 3 regardless of whether or not the impedance calculation and averaging process is being performed.

In a case where the mask signal is not ON (S16: NO), the FPGA acquires information regarding the impedance, that is, parameters for calculating the impedance on the load 8*a* side, from the high frequency detection unit 7 (S17). Then, the FPGA calculates the impedance on the load 8*a* side using the acquired parameters (S18), and sequentially averages the calculated impedance (S19). One impedance calculation ends within a time of 100 ns or less, for example. Thereafter, the FPGA determines whether or not the time T3 has passed based on the time measured by the timer (S20). In a case where the time T3 has not passed (S20: NO), the FPGA shifts the processing to step S16.

In a case where the time T3 has passed (S20: YES), the FPGA determines whether or not the initial flag is set to 1 (S21). In a case where the initial flag is set to 1 (S21: YES), that is, in a case where the first calculation and averaging of the impedance have ended, the FPGA outputs the averaged impedance on the load 8*a* side (more specifically, data indicating the impedance) to the CPU (S22), and clears the initial flag to 0 (S23). The data output in step S22 is input to the above-described FIFO memory.

In a case where the processing of step S23 has ended or in a case where the initial flag is not set to 1 in step S21 (S21: NO), the FPGA shifts the processing to step S15 so as to repeat the calculation and averaging of the impedance on the load 8*a* side. The FPGA may acquire the parameters for calculating the reflection coefficient in step S17. In this case, the FPGA calculates the reflection coefficient of the case where the load 8*a* side is viewed in step S18, sequentially averages the reflection coefficient in step S19, and outputs the averaged reflection coefficient in step S20.

In a case where the process illustrated in FIG. 4 is started, the CPU determines whether or not the impedance calculated and averaged by the FPGA can be input from the above-described FIFO memory (S31). In a case where the impedance calculated and averaged by the FPGA cannot be input from the FIFO memory (S31: NO), the process illustrated in FIG. 4 ends without performing the subsequent impedance matching operation. In a case where the averaged impedance can be input from the FIFO memory (S31: YES), the CPU acquires the averaged impedance from the FIFO memory (S32), and calculates the capacitance of the variable capacitor 1 so that the impedance on the load 8a side matches the output impedance of the high frequency power supply 6a (S33).

Then, the CPU determines ON/OFF states to be taken by the semiconductor switches 21, 22, . . . , 28 so that the capacitance of the variable capacitor 1 becomes the calculated capacitance (S34). Thereafter, the CPU stores the determined ON/OFF states in the above-described buffer memory (S35), and shifts the processing to step S31. Steps S33 and S34 correspond to an operation unit.

In a case where the FPGA outputs the reflection coefficient in the processing illustrated in FIG. 3, the CPU acquires the averaged reflection coefficient in step S32 of FIG. 4 and calculates the capacitance of the variable capacitor 1 so that the reflection coefficient of the case where the load 8a side is viewed approaches 0, in step S33.

In a case where the process illustrated in FIG. 5 is started, the CPU turns on the mask signal for the FPGA (S41), and then reads the determined ON/OFF states from the buffer memory (S42). Then, the CPU reads the ON/OFF states before the semiconductor switches 21, 22, . . . , 28 are switched, that is, the present ON/OFF states (S43). This ON/OFF states are stored in a temporary storage memory when the process illustrated in FIG. 5 is started last time. The CPU compares the ON/OFF states read in step S43 with the ON/OFF states read from the buffer memory in step S42 (S44).

The CPU extracts bits that change from ON to OFF or from OFF to ON based on the comparison result (S45), and substitutes the number of changing bits for j (S46). Then, the CPU determines whether or not j is 0, that is, whether or not there is a changing bit (S47). In a case where j is 0 (S47: YES), the CPU shifts the processing to step S55 described later so as to turn off the mask signal. In a case where j is not 0 (S47: NO), the CPU initializes k to 8 (S48).

Thereafter, the CPU determines whether or not Bk is a bit that changes from ON to OFF or from OFF to ON (S49). Bk is the k-th bit among the bits of the semiconductor switches 21, 22, . . . , 28. In a case where Bk is not a changing bit (S49: NO), the CPU shifts the processing to step S53 described later so as to search for a changing bit. In a case where Bk is a changing bit (S49: YES), the CPU actually performs ON/OFF switching of the k-th semiconductor switch corresponding to Bk (S50).

Thereafter, the CPU decrements j by 1 (S51), and determines whether or not j is 0, that is, whether or not the number of remaining bits that change is 0 (S52). In a case where j is not 0 (S52: NO), the CPU decrements k by 1 (S53), and shifts the processing to step S49 so as to further search for a changing bit.

In a case where j is 0 in step S52 (S52: YES), that is, in a case where the number of remaining bits that change is 0, the CPU stores the ON/OFF states of the semiconductor switches 21, 22, . . . , 28 after switching in the temporary storage memory (S54), and turns off the mask signal (S55). Then, the CPU ends the process illustrated in FIG. 5. The ON/OFF states stored in the step S54 are read in step S43 as ON/OFF states before switching when the process illustrated in FIG. 5 is started next time. It is noted that the ON/OFF states after switching stored in step S54 match the ON/OFF states determined in step S34 of FIG. 4.

In the flowchart illustrated in FIG. 5, bits that change from ON to OFF or from OFF to ON among the bits of the semiconductor switches 21, 22, . . . , 28 are extracted, and ON/OFF of the semiconductor switches 21, 22, . . . , 28 is switched only for the extracted bits. However, the switching method of the semiconductor switches 21, 22, . . . , 28 is not limited to this switching method. For example, regardless of whether or not each bit of the semiconductor switches 21, 22, . . . , 28 changes, ON/OFF of the semiconductor switches 21, 22, . . . , 28 may be newly set for all the bits.

Specifically, steps S43 to 45, S47, and S49 among the steps illustrated in FIG. 5 are deleted (the process proceeds to the next numbered step). The CPU substitutes 8 (the total number of bits) for j in step S46, and newly sets ON/OFF for the k-th semiconductor switch corresponding to Bk in step S50.

As described above, according to Embodiment 1, amplitude shift modulation of the output power is performed at a predetermined frequency in the high frequency power supply 6a. Impedance matching between the high frequency power supply 6a and the load 8 is achieved in a state in which the output power of the high frequency power supply 6a is supplied to the load 8a. The FPGA acquires, from the high frequency detection unit 7, information regarding the impedance or the reflection coefficient of the case where the load 8a side is viewed from the output end of the high frequency power supply 6a or from a location equivalent to the output end (step S17). The FPGA calculates the impedance or the reflection coefficient on the load 8a side, using the acquired information (step S18). The location equivalent to the output end of the high frequency power supply 6a is, for example, an input end of the impedance matching device 100a on the high frequency power supply 6a side. The impedance matching device 100a is connected between the high frequency power supply 6a and the load 8a.

The output power is modulated to an H level and an L level in the first period and in second period respectively. In a case where the FPGA calculates the impedances on the load 8a side in the first period and in the second period, the CPU preforms matching operations in the subsequent second period and first period respectively so that the impedance on the load 8a side after adjustment approaches a complex conjugate of the output impedance of the high frequency power supply 6a (steps S33 and S34). In a case where the FPGA calculates the reflection coefficients in the first period and in the second period, the CPU performs matching operations in the subsequent second period and first period respectively so that the actual reflection coefficient approaches 0. The results of the matching operations performed in the second period and in the first period are reflected in the capacitance of the variable capacitor 1 in the subsequent first period and second period respectively. As a result, even in a case where the impedance on the load 8a side changes in the first period and the second period due to the influence of the modulation of the high frequency power supply 6a, impedance matching between the high frequency power supply 6a and the load 8a can be achieved in the first period and the second period after one period of amplitude shift modulation for the high frequency power supply 6a. Therefore, even in a case where amplitude shift modulation of the high frequency power supplied from the high frequency power supply 6a to the load 8a is performed, impedance matching between the high frequency power supply 6a and the load 8a can be achieved.

Embodiment 2

In Embodiment 1, one high frequency power supply 6a supplies power to the load 8a. Amplitude shift modulation of the high frequency power of the high frequency power supply 6a is performed. In Embodiment 2, two high frequency power supplies 6a and 6b supply power to a load 8b. Amplitude shift modulation of the high frequency power supply 6b is performed at a predetermined frequency. Here, impedance matching between the high frequency power supply 6a and the load 8b and impedance matching between the high frequency power supply 6b and the load 8b are achieved using two impedance matching devices 100a. The description will be given focusing on impedance matching between the high frequency power supply 6a and the load 8b, impedance of which changes due to the influence of amplitude shift modulation of the high frequency power supply 6b. Embodiment 2 shows an example, in which the high frequency power supplies 6a and 6b supply high frequency power to two electrodes of the load 8b respectively. However, the method for supplying high frequency power to the load 8b is not limited to this method. For example, high frequency powers output from the high frequency power supplies 6a and 6b may be combined. The combined power is supplied to the load 8a used in Embodiment 1, for example.

Figure 6:
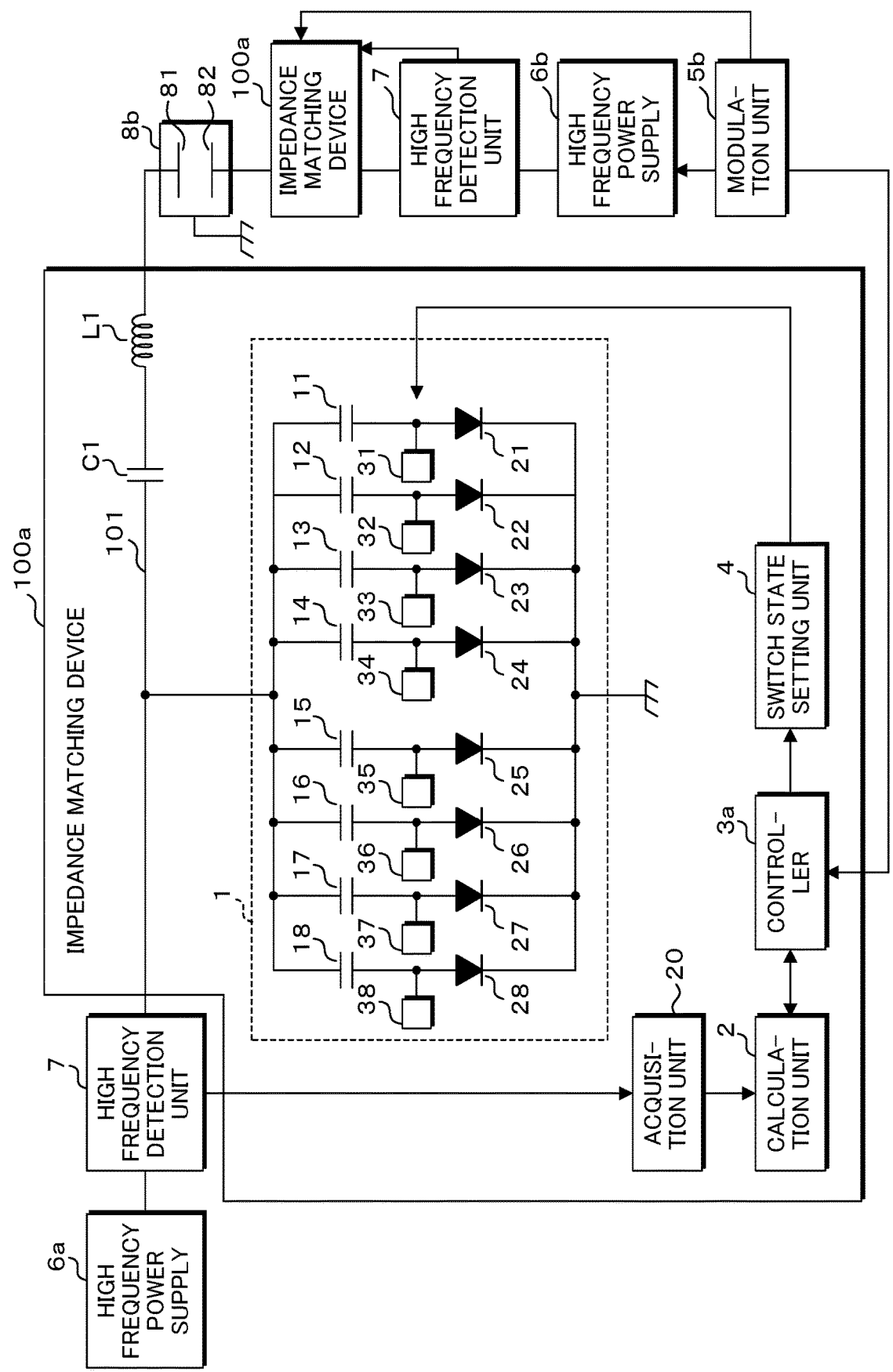
FIG. 6 is a block diagram illustrating a configuration example of an impedance matching device according to Embodiment 2 and an example of connection to the outside.

FIG. 6 is a block diagram illustrating a configuration example of the impedance matching device 100a according to Embodiment 2 and an example of connection to the outside. The load 8b in FIG. 6 is a plasma processing apparatus having an upper electrode 81 and a lower electrode 82 in a vacuum chamber, for example. The vacuum chamber is grounded. One impedance matching device 100a is provided between the high frequency power supply 6a (corresponding to a second high frequency power supply) and the upper electrode 81 of the load 8b. The high frequency power supply 6a (refer to FIG. 1) is not connected to the modulation unit 5a and outputs a continuous wave. A high frequency detection unit 7 is connected between the high frequency power supply 6a and the upper electrode 81. The high frequency detection unit 7 allows high frequency power to pass therethrough and detects parameters, such as a high frequency voltage. The configuration of the one impedance matching device 100a is the same as that of the impedance matching device 100a according to Embodiment 1. However, the external connection source connected to the controller 3a is different.

The other impedance matching device 100a is provided between the high frequency power supply 6b (corresponding to a first high frequency power supply) and the lower electrode 82 of the load 8b. The high frequency power supply 6b is connected to a modulation unit 5b. In high frequency power supply 6b, amplitude shift modulation of the high frequency power is performed. The high frequency detection unit 7 is connected between the high frequency power supply 6b and the lower electrode 82. Similarly as the case of Embodiment 1, the other impedance matching device 100a acquires the above-described parameters from the high frequency detection unit 7 and a modulation signal indicating the periods of H level and L level is given from the modulation unit 5b to the other impedance matching device 100a. The modulation unit 5b also gives the modulation signal to the controller 3a included by the one impedance matching device 100a. In addition, the same reference numerals are given to portions corresponding to Embodiment 1, and the description thereof will be omitted.

Figure 7:
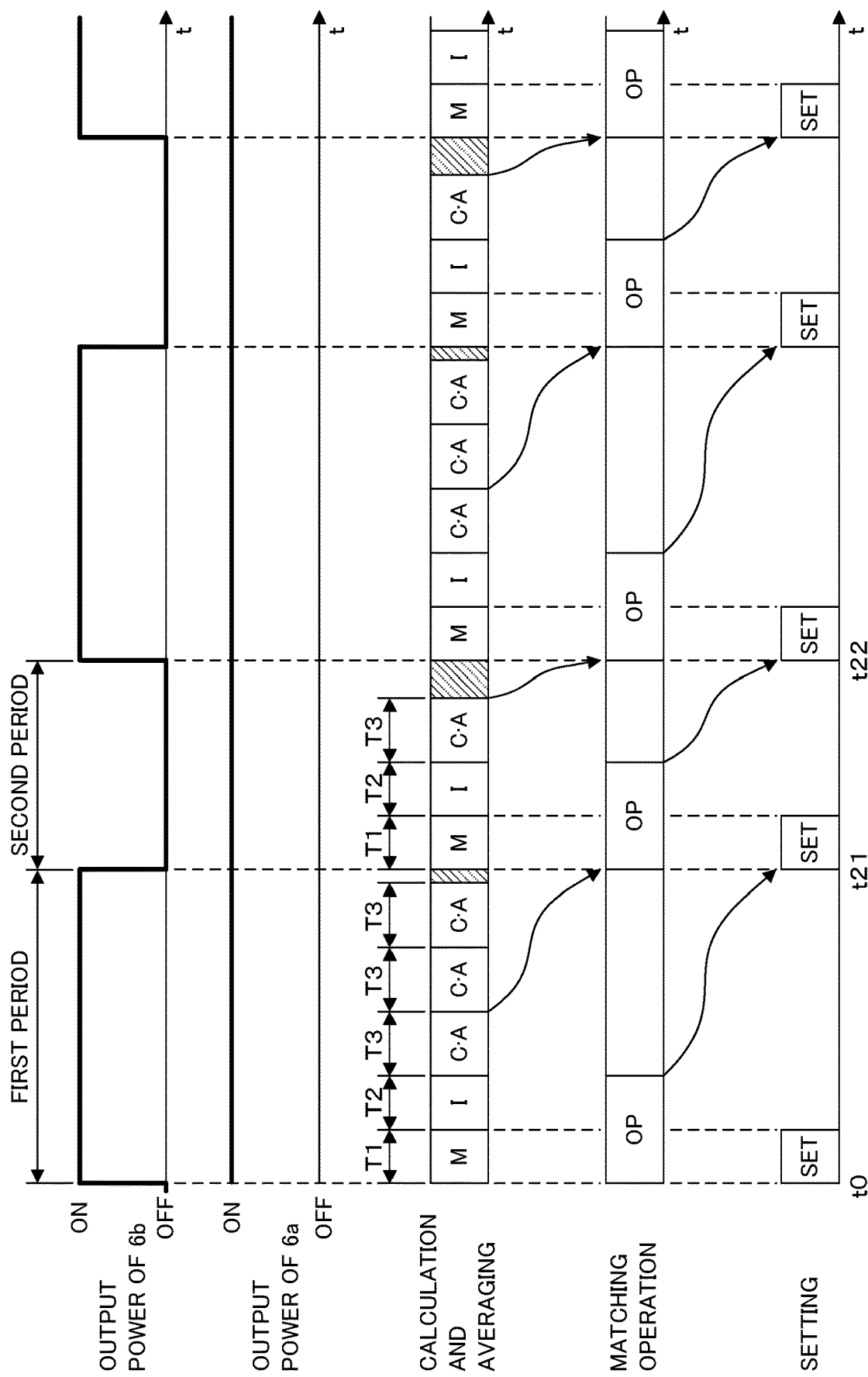
FIG. 7 is a timing chart showing the operation of the impedance matching device according to Embodiment 2.

FIG. 7 is a timing chart showing the operation of the impedance matching device 100a according to Embodiment 2. The five timing charts shown in FIG. 7 have the same time axis (t) as their horizontal axes. In order from the top, timings regarding the output power of the high frequency power supply 6b, regarding the output power of the high frequency power supply 6a, regarding calculation and averaging of the impedance on the load 8b side, regarding impedance matching operation, and regarding setting of the variable capacitor 1 are schematically shown. In FIG. 7, "C·A" means calculation and averaging, "OP" means a matching operation, "M" means ON of the mask signal, and "I" means an interval.

The difference from the timing charts shown in FIG. 2 of Embodiment 1 is a following point. The high frequency power supply 6b in which amplitude shift modulation of output power is performed is add and the output power of the high frequency power supply 6a is continuously ON. A first period from time t0 to t21 corresponds to a period in which the output power of the high frequency power supply 6b is at the H level. A second period from time t21 to t22 corresponds to a period in which the output power of the high frequency power supply 6b is at the L level. Therefore, the first period and the second period appear every modulation period relevant to the high frequency power supply 6b. This modulation period may be the same as or different from the modulation period relevant to the high frequency power supply 6a shown in FIG. 2 of Embodiment 1.

Similarly as the case of Embodiment 1, based on the results of calculations and averagings performed by the calculation unit 2 in the first period and in the second period, the controller 3a performs impedance matching operations in the subsequent second period and first period respectively. In each impedance matching operation, the capacitance of the variable capacitor 1 is calculated. Therefore, based on the result of calculation and averaging performed by the calculation unit 2 in the first period, the controller 3a performs an impedance matching operation in the subsequent second period. Based on the result of calculation and averaging performed by the calculation unit 2 in the second period, the controller 3a performs an impedance matching operation in the subsequent first period. Based on the results of the matching operations performed in the second period and the first period, the controller 3a performs the setting of the variable capacitor 1 in the subsequent first period and second period respectively. Therefore, based on the result of the matching operation performed in the second period, the controller 3a performs the setting of the variable capacitor 1 in the subsequent first period. Based on the result of the matching operation in the first period, the controller 3a performs the setting of the variable capacitor 1 in the subsequent second period.

As is apparent from comparison with FIG. 2 of Embodiment 1, the FPGA calculates and averages the impedance according to the mask signal given by the CPU, and performs exactly the same operation as the case of Embodiment 1. One CPU performs an impedance matching operation and the setting of the variable capacitor 1 in the processing that starts at the start time of each of the first period and the second period. Only the difference from Embodiment 1 is the start timing of each process. Here, a modulation signal indicating the first period and the second period is given to the controller 3a in both Embodiment 1 and Embodiment 2. Therefore, it is not needed that the trigger of the CPU for starting each of the above processes is changed. Also, in the case where the FPGA calculates a reflection coefficient, it is not needed that the trigger for starting each of the above processes is changed. Therefore, Embodiment 2 has the similar effects as Embodiment 1 without changing the processing content of the FPGA and the CPU.

As described above, according to Embodiment 2, amplitude shift modulation of the output power is performed at a predetermined frequency in the high frequency power supply 6b. The high frequency power supply 6a supplies power to the load 8. Impedance matching between the high frequency power supply 6a and the load 8b is achieved in a state in which the output power of the high frequency power supply 6b is further supplied to the load 8b. Information regarding the impedance or the reflection coefficient of the case where the load 8b side is viewed from the output end of the high frequency power supply 6a or from a location equivalent to the output end is acquired from the high frequency detection unit 7. The impedance or the reflection coefficient on the load 8a side is calculated using the acquired information. The location equivalent to the output end of the high frequency power supply 6a is, for example, an input end of the impedance matching device 100a on the high frequency power supply 6a side. The impedance matching device 100a is connected between the high frequency power supply 6a and the load 8b.

The output power of the high frequency power supply 6b is modulated to a high output and a low output in the first period and in second period respectively. In a case where the FPGA calculates the impedances on the load 8b side in the first period and in the second period, matching operations are performed in the subsequent second period and first period respectively so that the impedance on the load 8b side after adjustment approaches the complex conjugate of the output impedance of the high frequency power supply 6a. In a case where the FPGA calculates the reflection coefficients in the first period and in the second period, matching operations are performed in the subsequent second period and first period respectively so that the actual reflection coefficient approaches 0. The results of the matching operations performed in the second period and in the first period are reflected in the capacitance of the variable capacitor 1 in the subsequent first period and second period respectively. As a result, even in a case where the impedance on the load 8b side changes in the first period and the second period due to the influence of the modulation of the high frequency power supply 6b, impedance matching between the high frequency power supply 6a and the load 8b can be achieved in the first period and the second period after one period of amplitude shift modulation for the high frequency power supply 6b. Therefore, even in a case where amplitude shift modulation of the high frequency power supplied from the high frequency power supply 6b to the load 8b is performed, impedance matching between the high frequency power supply 6a and the load 8b can be achieved.

Embodiment 3

In Embodiment 1, one high frequency power supply 6a supplies power to the load 8a. Amplitude shift modulation of the high frequency power of the high frequency power supply 6a is performed. In Embodiment 3, amplitude shift modulations of both high frequency powers of the two high frequency power supplies 6a and 6b which supply powers to the load 8b used in Embodiment 2, are performed. The modulation frequency relevant to the high frequency power supply 6b is an integral multiple of the modulation frequency relevant to the high frequency power supply 6a. Here, impedance matching between the high frequency power supply 6a and the load 8b is achieved using an impedance matching device 100b. Impedance matching between the high frequency power supply 6b and the load 8b is achieved using the impedance matching device 100a. The description will be given focusing on impedance matching between the high frequency power supply 6a having a lower modulation frequency of high frequency power and the load 8b.

Figure 8:
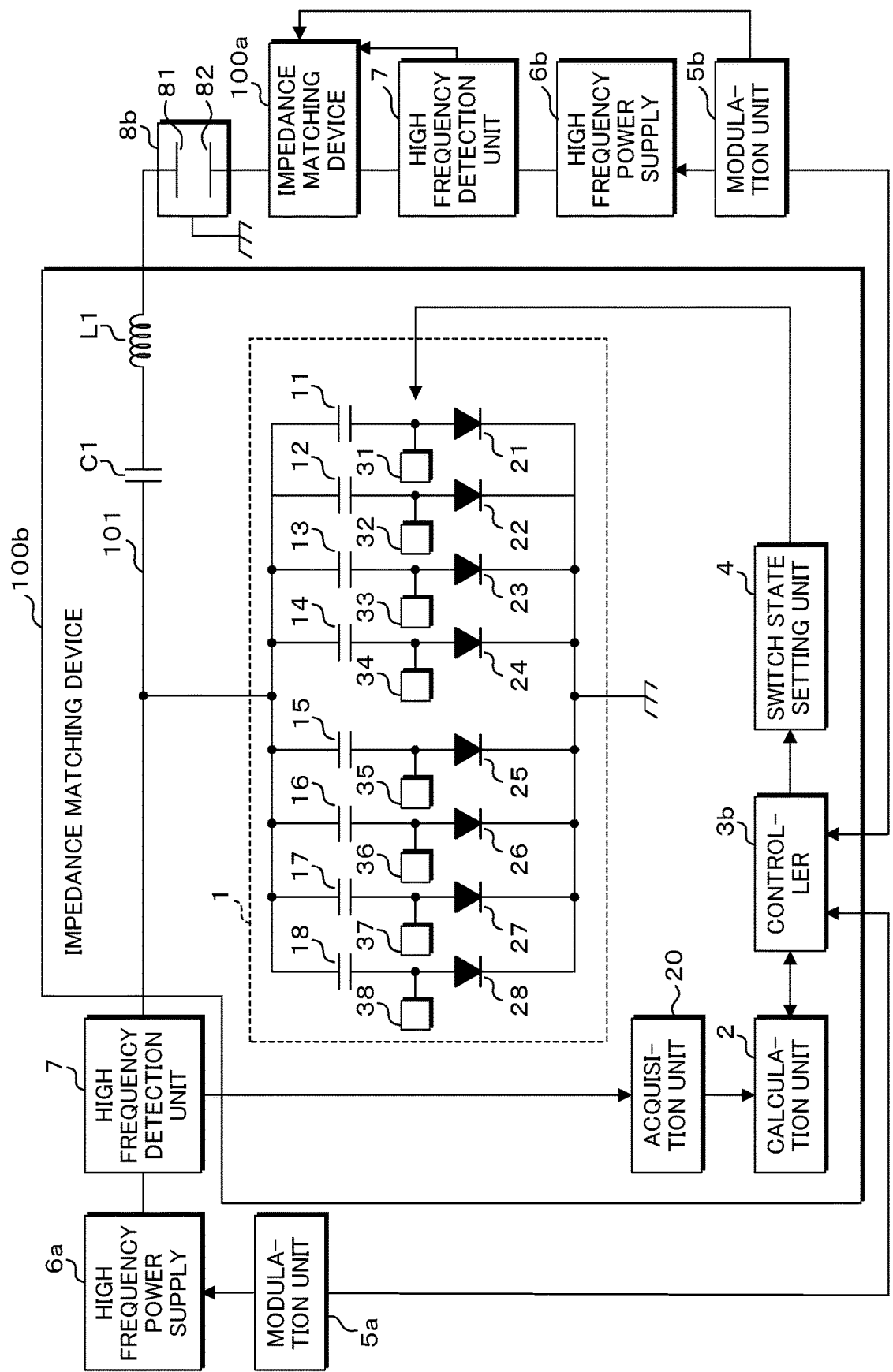
FIG. 8 is a block diagram illustrating a configuration example of an impedance matching device according to Embodiment 3 and an example of connection to the outside.

FIG. 8 is a block diagram illustrating a configuration example of the impedance matching device 100b according to Embodiment 3 and an example of connection to the outside. The impedance matching device 100b is provided between the high frequency power supply 6a and the upper electrode 81 of the load 8b. The modulation unit 5a is connected to the high frequency power supply 6a. Amplitude shift modulation of the high frequency power is performed at a predetermined frequency in the high frequency power supply 6a. The high frequency detection unit 7 is connected between the high frequency power supply 6a and the upper electrode 81. When the configuration of the impedance matching device 100b is compared with the configuration of the impedance matching device 100a according to Embodiment 1, an external connection source connected to a controller 3b is added.

The impedance matching device 100a is provided between the high frequency power supply 6b (corresponding to a second high frequency power supply) and the lower electrode 82 of the load 8b. The modulation unit 5b is connected to the high frequency power supply 6b. In the high frequency power supply 6b, amplitude shift modulation of the high frequency power is performed at a frequency that is an integral multiple of the predetermined frequency. The high frequency detection unit 7 is connected between the high frequency power supply 6b and the lower electrode 82. Similarly as the cases of Embodiments 1 and 2, the impedance matching device 100a acquires the above-described parameters from the high frequency detection unit 7 and a modulation signal indicating the periods of H level and L level is given from the modulation unit 5b to the impedance matching device 100a. The modulation unit 5b also gives the modulation signal to the controller 3b included by the impedance matching device 100b. In addition, the same reference numerals are given to portions corresponding to Embodiments 1 and 2, and the description thereof will be omitted.

FIG. 9 is a timing chart showing the operation of the impedance matching device 100b according to Embodiment 3. The five timing charts shown in FIG. 9 have the same time axis (t) as their horizontal axes. In order from the top, timings regarding the output power of the high frequency power supply 6b, regarding the output power of the high frequency power supply 6a, regarding calculation and averaging of the impedance on the load 8b side, regarding impedance matching operation, and regarding setting of the variable capacitor 1 are schematically shown. In FIG. 9, "M" means ON of the mask signal. "I" means an interval. "C" means calculation and averaging. "OP" means a matching operation. "S" means setting.

The difference from the timing charts shown in FIG. 2 of Embodiment 1 is that the high frequency power supply 6b in which amplitude shift modulation of output power is performed is added. A first period from time t0 to t31 corresponds to a period in which the output power of the high frequency power supply 6a is at the H level. A second period from time t31 to t32 corresponds to a period in which the output power of the high frequency power supply 6a is at the L level. Therefore, the first period and the second period appear every modulation period relevant to the high frequency power supply 6a. This modulation period may be the same as or different from the modulation period relevant to the high frequency power supply 6a shown in FIG. 2 of Embodiment 1.

A third period from time t0 to t41 corresponds to a period in which the output power of the high frequency power supply 6b is ON. A fourth period from time t41 to t42 corresponds to a period in which the output power of the high frequency power supply 6b is OFF. Therefore, the third period and the fourth period appear every modulation period relevant to the high frequency power supply 6b. A third period from time t42 to t43 is similar as the third period from time t41 to t42. A fourth period from time t43 to t32 is similar as the fourth period from time t41 to t42. FIG. 9 shows an example in which the start time of the first period relevant to the high frequency power supply 6a matches the start time of the third period relevant to the high frequency power supply 6b. However, the relationship between start times of the first period and the third period is not limited to this relationship. There may be a difference between the start times of the first period and the third period. Further, the high frequency power of the high frequency power supply 6b may be changed to H level and L level.

The following point is a difference from the case of Embodiment 1. Based on the results of calculations and averagings performed by the calculation unit 3b in the third period and the fourth period included in the first period, the controller 3b performs impedance matching operations sequentially in the subsequent second period. In each impedance matching operation, the capacitance of the variable capacitor 1 is calculated. In the example shown in FIG. 9, the third period appears twice in the first period. However, in the second third period, the first period ends and the next mask signal is turned on until the calculation and averaging end. For this reason, it does not means that the calculation and averaging of impedance in the second third period are performed. Therefore, in the subsequent second period, the matching operation is performed twice. In addition, based on the results of calculations and averagings performed by the calculation unit 2 in the third period and the fourth period included in the second period, the controller 3b performs impedance matching operations sequentially in the subsequent first period. In each impedance matching operation, the capacitance of the variable capacitor 1 is calculated.

Based on the results of the matching operations performed sequentially in the second period, the controller 3b performs the setting of the variable capacitor 1 in the third period and the fourth period included in the subsequent first period. Therefore, based on the result of calculation and averaging performed by the calculation unit 2 in the third period included in the preceding first period, the controller 3b performs the setting of the variable capacitor 1 in the third period included in the subsequent first period. Based on the result of calculation and averaging performed by the calculation unit 2 in the fourth period included in the preceding first period, the controller 3b performs the setting of the variable capacitor 1 in the fourth period in the subsequent first period. In the example shown in FIG. 9, as described above, the third period appears twice in the first period. However, since the matching operation is performed only twice in the immediately preceding second period, the third setting of the variable capacitor 1 is not substantially performed (indicated by X mark in FIG. 9).

Based on the results of matching operations performed sequentially in the first period, the controller 3b performs the setting of the variable capacitor 1 in the third period and in the fourth period included in the subsequent second period. Therefore, based on the results of calculation and averaging performed by the calculation unit 2 in the third period included in the preceding second period, the controller 3b performs the setting of the variable capacitor 1 in the third period included in the subsequent second period. Based on the results of calculation and averaging performed by the calculation unit 2 in the fourth period included in the preceding second period, the controller 3b performs the setting of the variable capacitor 1 in the fourth period included in the subsequent second period.

As is apparent from comparison with FIG. 2 of Embodiment 1, the FPGA calculates and averages the impedance according to the mask signal given by the CPU, and performs exactly the same operation as the case of Embodiment 1.

One CPU sequentially performs an impedance matching operation in the processing that starts at the start time of each of the first period and the second period. Only the difference from Embodiment 1 is the number of matching operations performed by one start. Here, referring to the processing procedure of the FPGA illustrated in FIG. 3 of Embodiment 1, the FPGA inputs the averaged impedance to the FIFO memory in step S22. In addition, referring to the processing procedure of the CPU illustrated in FIG. 4, the CPU acquires the averaged impedance from the FIFO memory in step S32. Therefore, the averaged impedance can be input to the FIFO memory multiple times according to the processing procedure illustrated in FIG. 3 of Embodiment 1, and the averaged impedance can be acquired from the FIFO memory multiple times according to the processing procedure illustrated in FIG. 4. Then, matching operations can be performed sequentially.

The CPU performs the setting of the variable capacitor 1 in the processing that starts at the start time of each of the third period and the fourth period. The start timing of this process is different from that of Embodiment 1. A modulation signal indicating the third period and the fourth period is given to the controller 3b. Regarding the process illustrated in FIG. 5 of Embodiment 1, in Embodiment 3 the start timing of the process of the CPU is changed to the start time of each of the third period and the fourth period.

Here, referring to the processing procedure of the CPU illustrated in FIG. 4 of Embodiment 1, the CPU stores the determined ON/OFF states in the buffer memory in step S35. In addition, referring to the processing procedure of the CPU illustrated in FIG. 5, the CPU reads the determined ON/OFF states from the buffer memory in step S42. Therefore, a so-called ring buffer is used as this buffer. The determined ON/OFF states can be stored in the ring buffer multiple times in accordance with the processing procedure illustrated in FIG. 4. The determined ON/OFF states can be read once at each of the start times of the third period and the fourth period in accordance with the processing procedure illustrated in FIG. 5. Thereby, the setting of the variable capacitor 1 can be performed. In a case where reading is performed after the ring buffer becomes empty (indicated by X mark in FIG. 9), the setting of the variable capacitor 1 may not be performed, or the same setting as the previous time may be performed.

From the above, the FPGA can perform the process illustrated in FIG. 3 of Embodiment 1 as it is. It is only needed that the start timing of the process of the CPU illustrated in FIG. 5 is changed in Embodiment 3. In the case where the CPU performs processes in accordance with the processing procedures illustrated in FIGS. 4 and 5 as it is, Embodiment 3 has the similar effects as Embodiments 1 and 2. The case where the FPGA calculates a reflection coefficient is similar as the case where the FPGA calculates an impedance on the load 8b side.

As described above, according to Embodiment 3, amplitude shift modulation of the output power is performed at a frequency which is an integral multiple of the predetermined frequency in the high frequency power supply 6b. Impedance matching between the high frequency power supply 6a according to Embodiment 1 and the load 8b is achieved in a state in which the output power of the high frequency power supply 6b is further supplied to the load 8b. The output power of the high frequency power supply 6b is modulated to ON and OFF in the third period and the fourth period, respectively.

In a case where the impedances on the load 8b side are calculated in the third period and in the fourth period included in the first period, matching operations are sequentially performed in the subsequent second period so that the impedance on the load 8b side after adjustment approaches the complex conjugate of the output impedance of the high frequency power supply 6a. Similarly, in a case where the impedances on the load 8b side are calculated in the third period and in the fourth period included in the second period, matching operations are sequentially performed in the subsequent first period so that the impedances on the load 8b side after adjustment approach the complex conjugate of the output impedance of the high frequency power supply 6a. In a case where the reflection coefficients are calculated in the third period and in the fourth period included in the first period, matching operations are sequentially performed in the subsequent second period so that the actual reflection coefficients approach zero. Similarly, in a case where the reflection coefficients are calculated in the third period and in the fourth period included in the second period, matching operations are sequentially performed in the subsequent first period so that the actual reflection coefficients approach zero.

The results of the matching operations sequentially performed in the second period are reflected in the capacitance of the variable capacitor 1 in the third period and in the fourth period included in the subsequent first period. Similarly, the results of the matching operations sequentially performed in the first period are reflected in the capacitance of the variable capacitor 1 in the third period and in the fourth period included in the subsequent second period. Therefore, even in a case where the impedance on the load 8b side changes in the third period and the fourth period due to the influence of the modulation of the high frequency power supply 6b, impedance matching between the high frequency power supply 6a and the load 8b can be achieved in the first period and the second period after one period of amplitude shift modulation for the high frequency power supply 6a.

It is noted that, as used herein and in the appended claims, the singular forms "a", "an", and "the" include plural referents unless the context clearly dictates otherwise.

It should be considered that the embodiments disclosed this time are examples in all points and not restrictive. The scope of the invention is defined by the claims rather than the meanings set forth above, and is intended to include all modifications within the scope and meaning equivalent to the claims. In addition, the technical features described in the embodiments can be combined with each other.

What is claimed is:

1. An impedance matching device which is to be provided between a load and a high frequency power supply in which amplitude shift modulation of output power is performed at a predetermined frequency, the impedance matching device achieving impedance matching between the high frequency power supply and the load, comprising:
    a calculator;
    a controller; and
    a matching circuit for achieving the impedance matching,
    wherein:
    in the high frequency power supply, the output power is modulated to a high output and a low output alternately,
    a first period and a second period are repeated alternately, the first period being a period in which the output power is the high output, the second period being a period in which the output power is the low output,
    the calculator calculates an impedance or a reflection coefficient of a case where the load side is viewed from an output end of the high frequency power supply or from a location equivalent to the output end, using information regarding the impedance of the case where the load side is viewed,
    the controller performs, based on a result of the calculation performed by the calculator in the first period, an operation for the impedance matching in the second period subsequent to the first period in which the calculation is performed,
    the matching circuit achieves, based on a result of the operation performed by the controller in the second period, the impedance matching in the first period subsequent to the second period in which the operation is performed,
    the controller performs, based on a result of the calculation performed by the calculator in the second period, an operation for the impedance matching in the first period subsequent to the second period in which the calculation is performed, and
    the matching circuit achieves, based on a result of the operation performed by the controller in the first period, the impedance matching in the second period subsequent to the first period in which the operation is performed.

2. The impedance matching device according to claim 1, wherein:
    power is supplied to one end of the load from the high frequency power supply,
    power is supplied to the other end of the load from a second high frequency power supply in which amplitude shift modulation of output power is performed at a frequency that is an integral multiple of the predetermined frequency,
    in the second high frequency power supply, the output power is modulated to a high output and a low output alternately,
    a third period and a fourth period are repeated alternately, the third period being a period in which the output power of the second high frequency power supply is the high output, the fourth period being a period in which the output power of the second high frequency power supply is the low output,
    a sum of the first period and the second period is the integral multiple of a sum of the third period and the fourth period,
    the controller performs, based on a result of the calculation performed by the calculator in the third period included in the first period, an operation for the impedance matching in the second period after the third period in which the calculation is performed, and
    the matching circuit achieves, based on a result of the operation performed by the controller in the second period, the impedance matching in the third period included in the first period subsequent to the second period in which the operation is performed,
    the controller performs, based on a result of the calculation performed by the calculator in the fourth period included in the first period, an operation for the impedance matching in the second period after the fourth period in which the calculation is performed, the matching circuit achieves, based on a result of the operation performed by the controller in the second period, the impedance matching in the fourth period included in the first period subsequent to the second period in which the operation is performed, the controller performs, based on a result of the calculation by the calculator in the third period included in the second period, an operation for the impedance matching in the first period after the third period in which the calculation is performed, the matching circuit achieves, based on a result of the operation performed by the controller in the first period, the impedance matching in the third period included in the second period subsequent to the first period in which the operation is performed the controller performs, based on a result of the calculation performed by the calculator in the fourth period included in the second period, an operation for the impedance matching in the first period after the fourth period in which the calculation is performed, the matching circuit achieves, based on a result of the operation performed by the controller in the first period, the impedance matching in the fourth period included in the second period subsequent to the first period in which the operation is performed.

3. An impedance matching device which is to be provided between a load, to which power is supplied from a first high frequency power supply in which amplitude shift modulation of output power is performed at a predetermined frequency, and a second high frequency power supply, the impedance matching device achieving impedance matching between the second high frequency power supply and the load, comprising:

a calculator;

a controller; and a matching circuit for achieving the impedance matching, wherein:

in the first high frequency power supply, the output power is modulated to a high output and a low output alternately, a first period and a second period are repeated alternately, the first period being a period in which the output power is the high output, the second period being a period in which the output power is the low output, the calculator calculates an impedance or a reflection coefficient of a case where the load side is viewed from an output end of the second high frequency power supply or from a location equivalent to the output end, using information regarding the impedance of the case where the load side is viewed, the controller performs, based on a result of the calculation performed by the calculator in the first period, an operation for the impedance matching in the second period subsequent to the first period in which the calculation is performed, the matching circuit achieves, based on a result of the operation performed by the controller in the second period, the impedance matching first period subsequent to the second period in which the calculation is performed, the controller performs, based on a result of the calculation performed by the calculator in the second period, an operation for the impedance matching in the first period subsequent to the second period in which the calculation is performed, and the matching circuit achieves, based on a result of the operation performed by the controller in the first period, the impedance matching in the second period subsequent to the first period in which the operation is performed.

4. An impedance matching method for achieving impedance matching between a load and a high frequency power supply in which amplitude shift modulation of output power is performed at a predetermined frequency and the output power is modulated to a high output and a low output alternately, wherein a first period and a second period are repeated alternately, the first period being a period in which the output power is the high output, the second period being a period in which the output power is the low output, the impedance matching method comprising:

acquiring information regarding an impedance of a case where the load side is viewed from an output end of the high frequency power supply or from a location equivalent to the output end;

calculating the impedance or a reflection coefficient of the case where the load side is viewed, using the acquired information regarding the impedance;

performing, based on a result of the calculation performed in the first period, an operation for the impedance matching in the second period subsequent to the first period in which the calculation is performed;

achieving, based on a result of the operation performed in the second period, the impedance matching in the first period subsequent to the second period in which the calculation is performed;

performing, based on a result of the calculation performed in the second period, an operation for the impedance matching in the first period subsequent to the second period in which the calculation is performed; and achieving, based on a result of the operation performed in the first period, the impedance matching in the second period subsequent to the first period in which the operation is performed.

* * * * *